(12) United States Patent
Koerner

(10) Patent No.: US 9,166,604 B2
(45) Date of Patent: Oct. 20, 2015

(54) TIMING MONITOR FOR PLL

(75) Inventor: Heiko Koerner, Soedinig (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 146 days.

(21) Appl. No.: 13/455,572

(22) Filed: Apr. 25, 2012

(65) Prior Publication Data

US 2013/0285721 A1    Oct. 31, 2013

(51) Int. Cl.
| | | |
|---|---|---|
| H04L 7/00 | (2006.01) | |
| H04L 25/00 | (2006.01) | |
| H04L 25/40 | (2006.01) | |
| H03L 7/08 | (2006.01) | |
| H03K 21/00 | (2006.01) | |
| H03L 7/197 | (2006.01) | |
| H03K 21/02 | (2006.01) | |

(52) U.S. Cl.
CPC *H03L 7/08* (2013.01); *H03K 21/00* (2013.01); *H03K 21/026* (2013.01); *H03L 7/1976* (2013.01)

(58) Field of Classification Search
CPC ......... H03K 21/00; H03K 21/026; H03L 7/08
USPC .......................... 375/316, 324, 371–376, 224
See application file for complete search history.

(56) References Cited

U.S. PATENT DOCUMENTS

| | | | |
|---|---|---|---|
| 5,648,744 A | 7/1997 | Prakash et al. | |
| 6,133,770 A * | 10/2000 | Hasegawa | 327/156 |
| 7,932,760 B2 * | 4/2011 | Griffiths | 327/159 |
| 2005/0280473 A1 | 12/2005 | Puma et al. | |
| 2007/0183014 A1 * | 8/2007 | Coppola et al. | 359/238 |
| 2010/0020910 A1 * | 1/2010 | Bhagavatheeswaran et al. | 375/376 |

\* cited by examiner

*Primary Examiner* — Freshteh N Aghdam
(74) *Attorney, Agent, or Firm* — SpryIP, LLC

(57) ABSTRACT

Representative implementations of devices and techniques provide error detection for a phase-locked-loop (PLL) device. A timing monitor is arranged to count pulses output by one or more portions of the PLL device, a quantity or pattern of the pulses indicating an error of the PLL device.

23 Claims, 9 Drawing Sheets

TIMING MONITOR FOR PLL

BACKGROUND

Phase-locked-loop (PLL) devices are control systems that generate signals having a fixed relationship to the phase of a reference signal. Typically, a phase-locked loop device generates a desired signal in response to both the frequency and the phase of the reference signal as well as a control signal. Often this includes raising or lowering the frequency of a voltage controlled oscillator (VCO) until a modified form (a fraction, for example) of the VCO signal is matched with the reference signal in both frequency and phase. Phase-locked loops are widely used in radio, telecommunications, computers, and other electronic applications.

PLL devices may include a lock detector which compares the frequency of the modified output signal (e.g., the output of the VCO divided by a divider value) to the frequency of the reference signal, to determine whether the PLL device is "locked" to the desired frequency. The lock detector may output a "lock OK" signal when the compared frequencies are close or within an acceptable tolerance. Generally, the lock detector may be designed with a wide enough tolerance to accept certain lags and inconsistencies that may occur with sigma-delta modulator-based dividers, for example. Consequently, isolated and sporadic errors of the PLL device (such as a divider error, for example) may not be detected by the lock detector.

Other error detection methods may be used that include measurement of the VCO frequency spectrum or analysis of the VCO control voltage. Measurement of the VCO frequency spectrum may only detect those errors that fall outside of an acceptable range for the PLL device or for the particular application. Further, errors could go undetected for a substantial time, resulting in incorrect operation of the electronic appliance. Analysis of the VCO control voltage can be problematic, and may not yield the desired results. For example, on one hand, the VCO control voltage may be an analog signal that is not easily processed without additional analog to digital processing. Additionally, the VCO control voltage may maintain a predictable profile even while errors are occurring within the PLL, such as with an offset current.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

Representative implementations of devices and techniques provide error detection for a phase-locked-loop (PLL) device. In one implementation, a timing monitor can be used to count pulses output by one or more portions of the PLL device. A quantity or pattern of the pulses may indicate an error of the PLL device.

In one implementation, a timing monitor is arranged to receive the up or down pulses output from the phase detector to the charge pump of the PLL. The timing monitor may output an alert signal (an error bit, for example) based on the relative temporal positions of the up or down pulses and/or based on a quantity of successive pulses in one direction (i.e., up or down). For example, the timing monitor may output the alert signal when a quantity of consecutive "up" pulses or consecutive "down" pulses exceeds a preselected threshold value.

Various implementations and arrangements for error detection are discussed in this disclosure. Techniques and devices are discussed with reference to example phase-locked-loop (PLL) devices illustrated in the figures. For example, the discussion and figures make reference to a sigma-delta based PLL device. However, this is not intended to be limiting, and is for ease of discussion and illustrative convenience. The techniques and devices discussed may be applied to any of various PLL device designs, structures, and the like (e.g., analog, linear, digital, all-digital, etc.), and remain within the scope of the disclosure.

Implementations are explained in more detail below using a plurality of examples. Although various implementations and examples are discussed here and below, further implementations and examples may be possible by combining the features and elements of individual implementations and examples.

Example PLL Device

Figure 1:
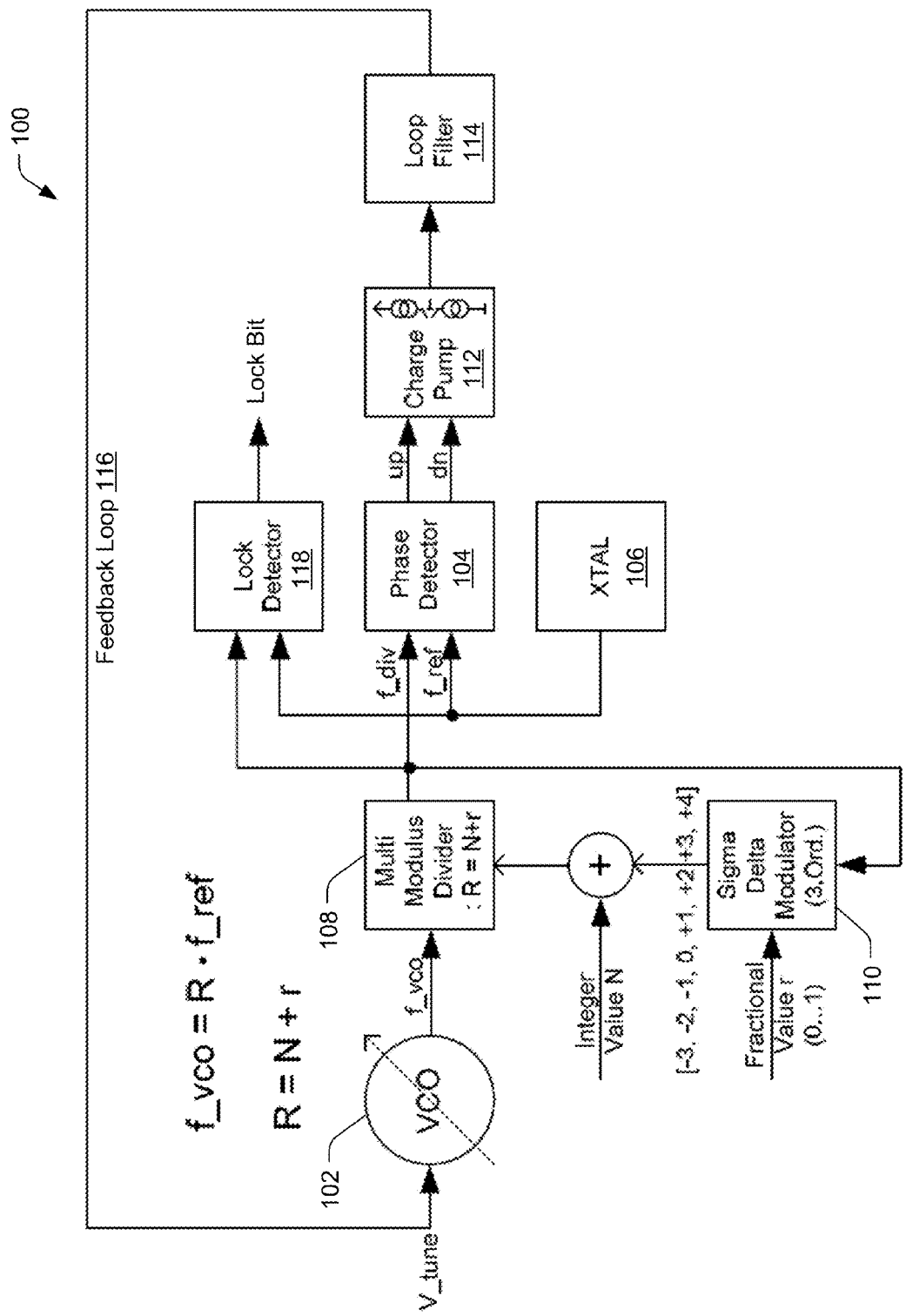
FIG. 1 is a block diagram of an example phase-locked-loop (PLL) device, according to an implementation.

FIG. 1 is a block diagram of an example phase-locked-loop (PLL) device 100, according to an implementation, wherein the techniques and devices described herein may be applied. As shown in FIG. 1, the example PLL 100 includes an oscillator 102 (e.g., voltage controlled oscillator (VCO), etc.) arranged to output a desired frequency (i.e., the PLL output frequency f_vco), based on one or more inputs. Inputs may include a control voltage V_tune, for example. In alternate implementations, inputs may include a digital word, or the like.

To ensure that the desired output frequency f_vco is stable, a modified form (f_div) of the output frequency f_vco is compared with a reference frequency f_ref, at a phase detector 104. In an implementation, the reference frequency f_ref may be supplied by a crystal oscillator 106, or the like. The modified frequency f_div is acquired by dividing the output frequency f_vco by a divider value R, and is intended to match the reference frequency f_ref in phase and frequency.

The divider value R may be determined (i.e., output) by a divider block, for example. In FIG. 1, an example divider block is comprised of a Multi-Modulus Divider 108 and a Sigma-Delta Modulator 110. In one implementation, as illustrated in FIG. 1, the Sigma-Delta Modulator 110 is a third-order Multi-Stage Noise Shaping (MASH) Sigma-Delta Modulator 110. In the example shown, an integer N is combined with a fractional value r, output from the Sigma-Delta Modulator 110, and the combination is output to the Multi-Modulus Divider 108. The output of the Multi-Modulus Divider 108 is the modified frequency f_div, which is the output frequency f_vco divided by the divider value R. In an implementation, as shown in FIG. 1, the modified frequency f_div may be fed back to the Sigma-Delta Modulator 110 as part of determining the divider value R.

Figure 3:
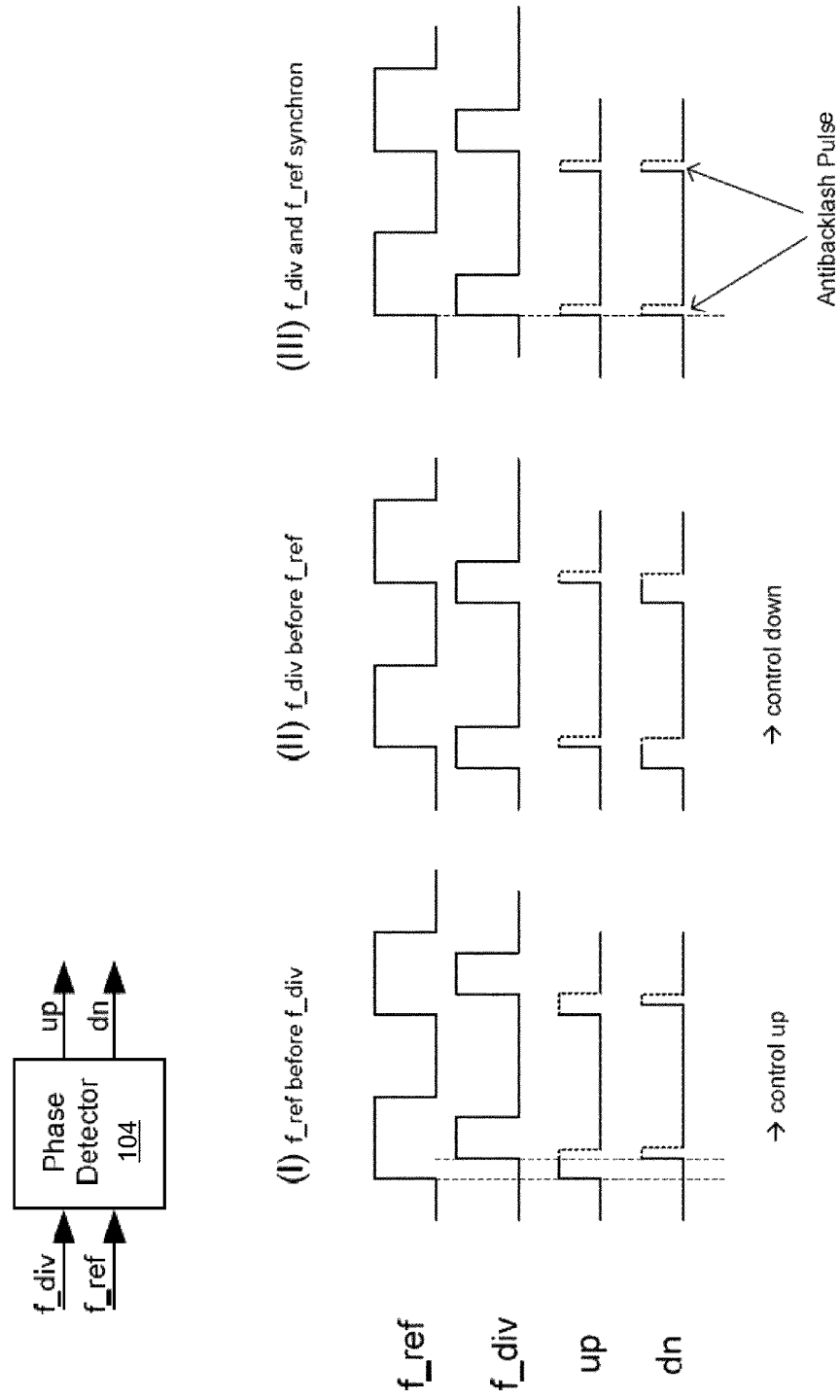
FIG. 3 is a timing diagram of an example phase detector, as included in the example PLL device of FIG. 1, according to an implementation. The timing diagram shows three timing scenarios regarding a pair of input signals and a pair of resulting output signals.

As shown in FIG. 1, the phase detector 104 (a type 4—phase frequency detector, for example) compares the phase angle ("phase") of the modified frequency f_div with the phase of the reference frequency f_ref, and outputs a control signal pulse on at least one of two outputs (up or dn) to the charge pump 112, based on the comparison. If the phase of the reference frequency f_ref is leading the phase of the modified frequency f_div, then the phase detector outputs an up (up) signal. Conversely, if the phase of the reference frequency f_ref is lagging the phase of the modified frequency f_div, then the phase detector 104 outputs a down (dn) signal. In one implementation, as illustrated in FIG. 1, the phase detector 104 outputs the up and dn signals on individual signal paths to the charge pump 112. In a further implementation, (as illustrated in FIG. 3) the phase detector 104 outputs a control signal pulse on each of the two outputs concurrently when the phase of the reference frequency f_ref is substantially equal to the phase of the modified frequency f_div.

In one implementation, the charge pump 112 is arranged to adjust the output frequency of the PLL f_vco based on the control signal output at the phase detector 104. For example, in an implementation, the charge pump 112 includes a positive current source and a negative current source. When the charge pump 112 receives an up signal, a positive current is output from the charge pump 112, adding to the control voltage signal V_tune via the feedback loop 116. The increased control voltage V_tune causes the VCO 102 to increase the frequency of the PLL output f_vco. Conversely, when the charge pump 112 receives a dn signal, a negative current is output from the charge pump 112, reducing (adding a negative value to) the control voltage signal V_tune via the feedback loop 116. The decreased control voltage V_tune causes the VCO 102 to decrease the frequency of the PLL output f_vco. Accordingly, the output frequency f_vco is adjusted based on the output of the charge pump 112, which is controlled by control signals output from the phase detector 104.

As mentioned above, an example PLL device 100 may include a lock detector 118. The lock detector 118 outputs a "lock bit" when the modified frequency f_div is substantially equal to the reference frequency f_ref, within an acceptable tolerance. The lock bit may be used to indicate that the PLL device is locked to the desired output frequency.

The techniques, components, and devices described herein with respect to the PLL device 100 are not limited to the illustration in FIG. 1, and may be applied to other PLL device designs without departing from the scope of the disclosure. In some cases, additional or alternative components may be used to implement the techniques described herein. It is to be understood that a PLL device 100 may be implemented as stand-alone device or as part of another system (e.g., integrated with other components, systems, etc.).

Example Timing Monitor

Figure 2:
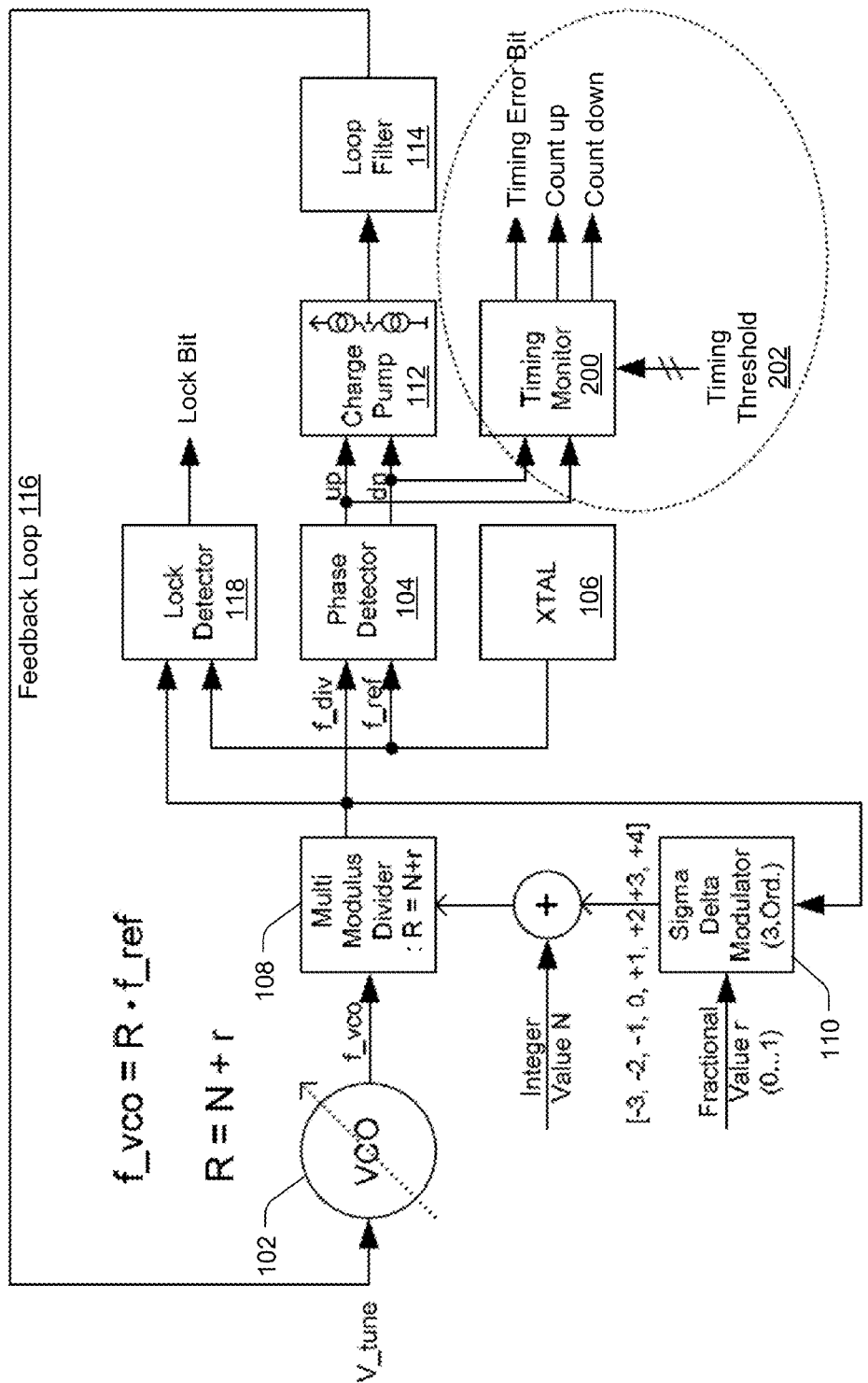
FIG. 2 is block diagram of the example PLL device of FIG. 1, also including a timing monitor, according to an implementation.

FIG. 2 is block diagram of the example PLL device 100 of FIG. 1, also including a timing monitor 200, according to an implementation. In the implementation, a timing monitor 200 may be arranged to receive the control signal(s) (up and dn) from the phase detector 104, for PLL device 100 error detection. Errors in the PLL device 100 may cause the PLL device 100 to overcompensate in a positive or negative direction, and may include interference signals from inside or outside the system, incorrect divider values, asymmetries in the PLL circuit such as leakage currents, and the like.

In one implementation, the timing monitor 200 may output an alert signal, such as a timing error bit, for example, when an error is detected at the PLL device 100. In one example, the timing monitor 200 may count the up and dn signals and output the timing error bit when a count of either consecutive up or dn pulses exceeds a preselected timing threshold 202.

In various implementations, the timing monitor 200 may output a count of consecutive up or dn pulses on outputs, "Count up" and "Count down," respectively. The output counts may be monitored, for example, for patterns or quantities indicating PLL device 100 errors. In an alternate implementation, the output counts may be monitored by a self-test system, an error monitoring system, diagnostic system, or the like, of the electronic appliance in which the PLL device 100 is used.

FIG. 3 is a timing diagram of an example phase detector 104, as included in the example PLL device 100 of FIGS. 1 and 2, according to an implementation. The timing diagram of FIG. 3 shows three timing scenarios regarding a pair of input signals (f_ref and f_div) and a pair of resulting output (i.e., control) signals (up and dn) of the phase detector 104. In an implementation, as illustrated in FIG. 3, the input signals and output signals of the phase detector 104 are binary pulse signals.

In the first example timing scenario (I), the input signal f_ref leads the input signal f_div. In this scenario, an up pulse is output from the phase detector while the f_ref pulse is present at an input, and until the f_div pulse appears at another input. In an implementation, as shown in FIG. 3, while the up pulse ceases with the appearance of the f_div pulse, the falling edge of the up pulse may extend past the rising edge of the f_div pulse. Accordingly, for stability, a dn pulse may be output from the phase detector 104 for a duration comprising the time from the rising edge of the f_div pulse to the falling edge of the up pulse.

In the second example timing scenario (II), the input signal f_div leads the input signal f_ref. In this scenario, a dn pulse is output from the phase detector while the f_div pulse is present at an input, and until the f_ref pulse appears at another input. In an implementation, as shown in FIG. 3, while the dn pulse ceases with the appearance of the f_ref pulse, the falling edge of the dn pulse may extend past the rising edge of the f_ref pulse. Accordingly, for stability, an up pulse may be output from the phase detector 104 for a duration comprising the time from the rising edge of the f_ref pulse to the falling edge of the dn pulse.

In the third example timing scenario (III), the input signal f_div is synchronized to the input signal f_ref. In this scenario, both input pulses arrive at substantially the same moment. No substantial up or dn pulses need be output by the phase detector, since the phase of the f_div signal does not need correction in comparison to the f_ref signal. However, in an implementation, as shown in FIG. 3, an up pulse and a dn pulse may be output from the phase detector 104 concurrently for a brief duration for stability (e.g., anti-backlash pulse).

Figure 4:
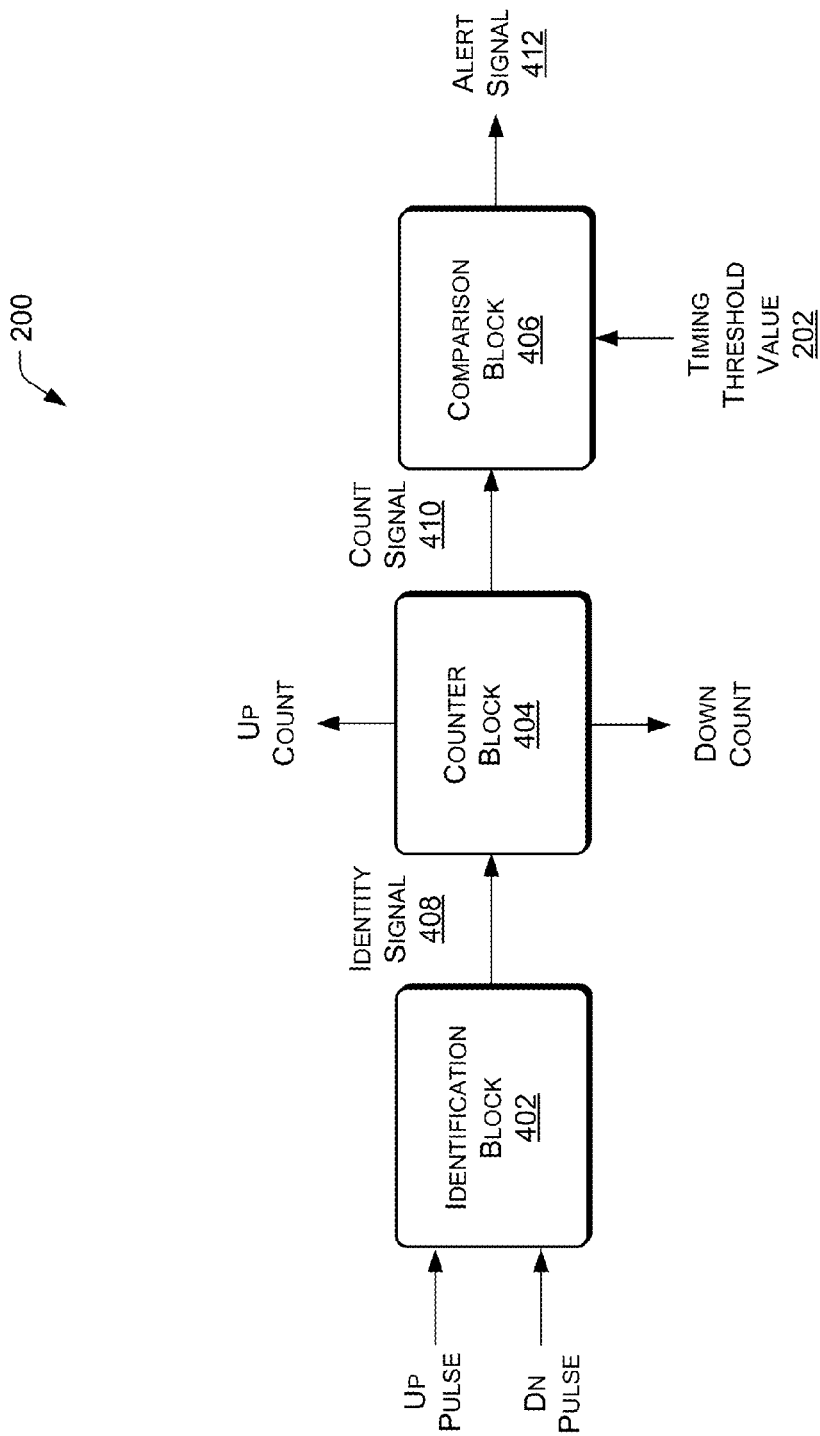
FIG. 4 is a high level block diagram of the example timing monitor of FIG. 2, according to an implementation.

In an implementation, the output (i.e., control) signals (up and dn pulses discussed above) from the phase detector 104 are received by the timing monitor 200, for error detection of the PLL device 100. FIG. 4 is a block diagram of the example timing monitor 200 of FIG. 2, according to an implementation.

In one implementation, as illustrated in FIG. 4, the timing monitor 200 may include an identification block 402, a counter block 404, and a comparison block 406. In alternate implementations, the timing monitor 200 may include fewer blocks, additional blocks, or alternate blocks to accomplish the techniques described herein.

If included, the identification block 402 is arranged to receive at least two signals (up pulse and dn pulse, for example) and to output one or more identity signals 408 (e.g., binary pulse signals) based on the logical values of the received signals. In one implementation, the identification block 402 receives the outputs of the phase detector 104, as described above. In one implementation, an identity signal 408 has a logical true value, for example, when one and only one of the received signals is logically true (binary 1, for example). In other words, the identification block 402 outputs an identity signal 408 indicating that one of the at least two signals received is logically true and another of the at least two signals received is logically false.

In the implementation, the identification block 402 outputs an identity signal 408 indicating a logically false value for the other possible combinations of received signals (e.g., where both received signals are logically true or both received signals are logically false.) In an implementation, the identification block 402 dynamically outputs the one or more identity signals 408 based on the received signals, as they change over time. Accordingly, an identity signal 408 may be a binary pulsed signal.

In one implementation, the identity signal 408 also indicates which of the received signals is logically true. For example, in one implementation, the identification block 402 may have two outputs (or as many outputs as it has inputs, for example). In the example, the identification block 402 may output a logically true identity signal 408 on an output associated with a logically true received input pulse and output a logically false identity signal 408 on one or more outputs associated with logically false received input signals.

In one implementation, the identification block 402 is arranged to receive as inputs the two outputs of the phase detector 104 and to output a first identity signal 408 when a control signal (e.g., a logical true value, a binary 1 value, etc.) appears on one of the two outputs of the phase detector 104 and the control signal does not appear on the other of the two outputs. In a further implementation, the identification block 402 is arranged to output a second identity signal 408 when the control signal appears on the other of the two outputs of the phase detector 104 and the control signal does not appear on the first of the two outputs. The identification block 402 ceases output of the identity signal 408 if the control signal appears on both of the two outputs of the phase detector 104 concurrently.

In an example implementation, as illustrated in FIG. 4, the identification block 402 includes one input associated with "up" control signals and another input associated with "dn" (down) control signals. Further, the identification block 402 includes one output for "up" identity signals 408 and another output for "dn" identity signals 408. In the implementation, a logically true value (i.e., control signal, pulse) appearing on the "up" input and a logically false value appearing on the "dn" input results in a logically true identity signal 408 on the up output and a logically false identity signal 408 on the dn output. Conversely, a logically true value appearing on the "dn" input and a logically false value appearing on the "up" input results in a logically true identity signal 408 on the dn output and a logically false identity signal 408 on the up output.

In the implementation, a logically true value appearing on both inputs (up and dn) concurrently or a logically false value appearing on both inputs (up and dn) concurrently results in logically false identity signals 408 on both outputs (up and dn).

In one alternate implementation, the identification block 402 is arranged to receive a single input signal (i.e., control signal) and to output an identity signal 408 indicating whether the signal is logically true or logically false. In alternate implementations, the identification block 402 may be arranged to receive three or more inputs, and output one or more identity signals 408 based on the logical truth of the signals, either individually or in logical combinations.

If included, the counter block 404 is arranged to count a quantity of successive identity signals 408 referencing the same one of the at least two received signals. For example, the counter block 404 is arranged to count a quantity of successive "up" identity signals 408 or a quantity of successive "dn" identity signals 408. In one implementation, the counter block 404 outputs a count signal 410, indicating the count of successive identity signals 408 to the comparison block 406.

In another implementation, the counter block 404 increments the count signal 410 with each successive like identity signal 408 received at the counter block 404.

In one implementation, a count by the counter block 404 in one "direction" causes a reset of a count in the opposite direction. For example, when the counter block 404 outputs an up count, the counter block 404 resets the down count. Likewise, when the counter block 404 outputs a down count, the counter block 404 resets the up count. This is also true for the count signal 410; it is reset when a count in the opposite "direction" is generated due to a received identity signal 408. In one implementation, the identity signal 408 resets the count of the counter block 404 when it is an opposite "direction" from an identity signal 408 previously received by the counter block 404.

In another implementation, the counter block 404 is arranged to output the count of successive "up" identity signals 408 and successive "dn" identity signals 408 on separate outputs. These outputs are shown in FIG. 4 as "up count" and "down count" respectively.

In one implementation, the counter block 404 is arranged to output the up count or the down count (and increment the count signal 410, if applicable) based on a relative temporal position of the at least two signals received by the identification block 402. In other words, if two logically true pulses arrive at the two inputs of the identification block 402 at roughly the same time (so that the pulses overlap), the identification block 402 outputs one logically true identity signal 408 indicating the first arriving control signal pulse. The identity signal 408 has a duration comprising the time from the rising edge of the first arriving pulse to approximately the rising edge of the later arriving pulse. For example, in one implementation, a logically true "up" pulse arrives at the up input of the identification block 402 just prior to a logically true "dn" pulse arriving at the dn input of the identification block 402, and the up and dn pulses have durations that overlap in time. In that case, the identification block 402 outputs an up identity signal 408 for a duration lasting from the rising edge of the up control pulse to approximately the rising edge of the dn control pulse. Accordingly, the counter block 404 outputs an up count upon receiving the up identity signal 408 from the identification block 402, and increments the count signal 410 if the previously received identity signal 408 was also an up identity signal 408.

If included, the comparison block 406 is arranged to output an alert signal 412 based on a comparison of a count signal 410, output from the counter block 404, to a preselected threshold value 202. In one implementation, the comparison block 406 outputs the alert signal 412 when the count from the counter block 404 (i.e., the count signal 410) is greater than the threshold value 202.

In one implementation, the threshold value 202 is a preselected value. For example, the threshold value 202 may be preselected by a user, a system, a program, or the like. In one implementation, the preselected threshold value 202 is a number between 1 and 5, for example. In other implementations, the preselected value 202 may be greater. In various implementations, the preselected threshold value 202 may be selected to fine tune error detection of the PLL device 100.

In a further implementation, the timing monitor 200 is arranged to output the alert signal 412 when the phase of one of the reference frequency f_ref or the modified frequency f_div leads the other frequency for a quantity of cycles greater than the preselected threshold value 202. As discussed above, the output of the phase detector 104, which is the control signals (up and dn), determine the identity signals 408, and therefore the counts 410.

The reference frequency f_ref and the modified frequency f_div are the inputs to the phase detector 104, and determine the output control signals (up and dn). When the phase of one of the reference frequency f_ref or the modified frequency f_div leads the other frequency for a quantity of cycles greater than the preselected threshold value 202, the resulting counts 410 can therefore also be greater than the preselected value 202. A comparison of the counts 410 to the preselected threshold value 202 determines whether an alert signal 412 is output (such as when the counts 410 exceed the preselected threshold value 202, for example).

Figure 5:
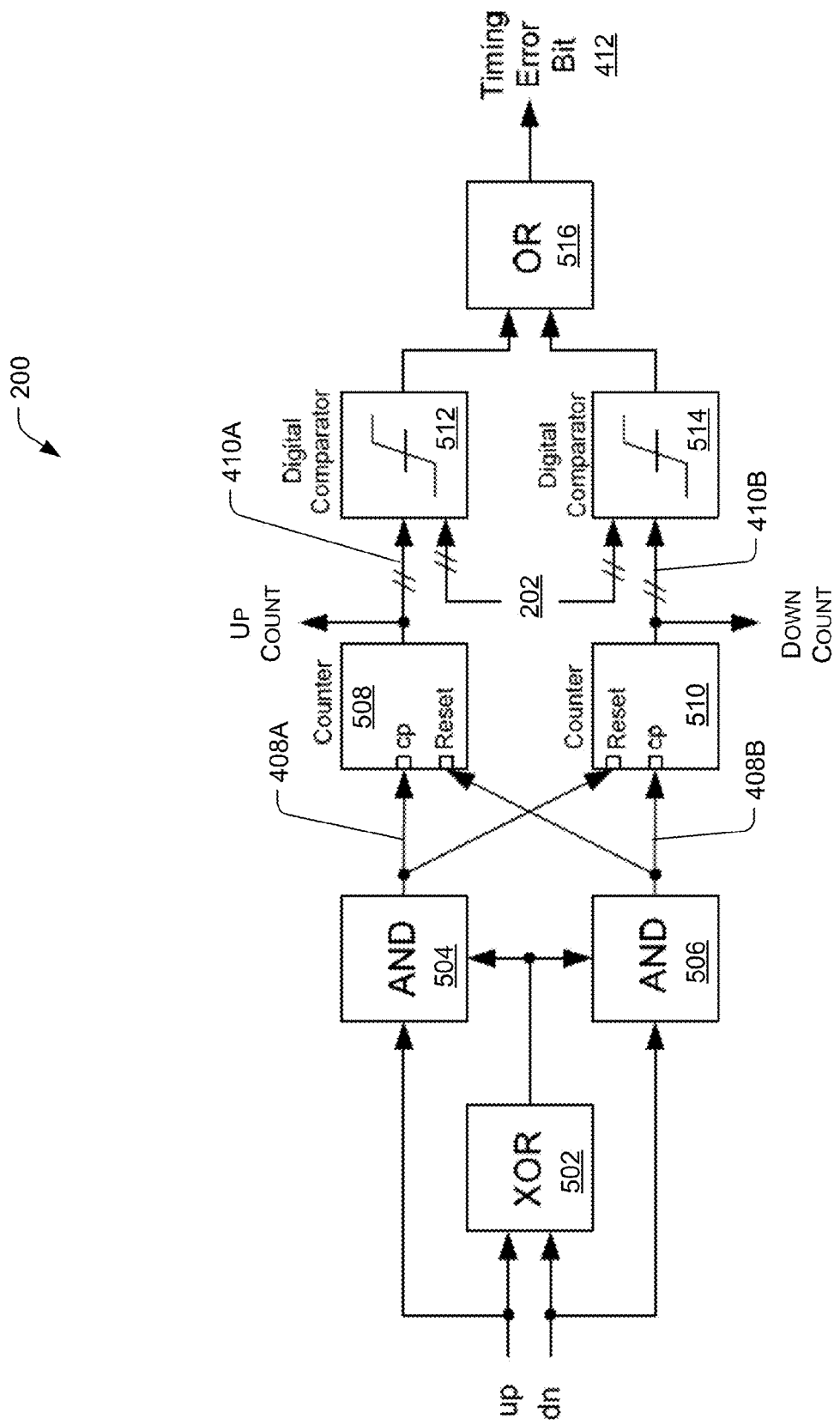
FIG. 5 is a detail level block diagram of the example timing monitor of FIG. 2, according to an implementation.

FIG. 5 is a block diagram of the example timing monitor 200 of FIGS. 2 and 4, according to an implementation. The illustration of FIG. 5 shows example detail of a timing monitor 200, according to the implementation. In alternate implementations, an example timing monitor 200 may have fewer, alternate, or additional components to implement the techniques described herein. In some implementations, the components comprising an example timing monitor 200 may be digital, analog, or mixed signal hardware components.

In an implementation, the identification block 402 of a timing monitor 200 comprises a logical "exclusive or" block 502 arranged to receive at least two input signals (e.g., the two control signal outputs of the phase detector 104). In one example, the control signals are binary pulse signals. In one implementation, the identification block 402 includes two logical "and" blocks (504 and 506) arranged to receive the output of the logical "exclusive or" block 502. One of the logical "and" blocks (504 and 506) is also arranged to receive one of the two input signals (e.g., outputs of the phase detector 104). The other of the two logical "and" blocks (504 and 506) is also arranged to receive the other of the two input signals (e.g., outputs of the phase detector 104).

In an implementation, an output of one of the two logical "and" blocks (504 and 506) is a first identity signal 408A and an output of the other of the two logical "and" blocks (504 and 506) is a second identity signal 408B. Accordingly, the combination of the "exclusive or" block 502 and the "and" blocks (504 and 506) ensure that one and only one logically true input signal results in a logically true identity signal 408. In various implementations, the "exclusive or" block 502 and/or the "and" blocks (504 and 506) may be implemented using digital logic components, for example.

In an implementation, the timing monitor 200 includes a first counter 508 arranged to count a quantity of successive first identity signals 408A and a second counter 510 arranged to count a quantity of successive second identity signals 408B. For example, the first counter 508 is arranged to count (and output) a first quantity 410A of successive true outputs of the first logical "and" block 504 and the second counter 510 is arranged to count (and output) a second quantity 410B of successive true outputs of the second logical "and" block 506.

In one implementation, as shown in FIG. 5, a logical true output of the first logical "and" block 504 resets the second counter 510 and a logical true output of the second logical "and" block 506 resets the first counter 508. Accordingly, in an implementation, the first identity signal 408A is arranged to reset the second counter 510, when it is logically true. Further, the second identity signal 408B is arranged to reset the first counter 508, when it is logically true.

In an implementation, the timing monitor 200 includes a first comparator 512 arranged to compare a count 410A of the first counter 508 to the preselected threshold value 202 and a second comparator 514 arranged to compare a count 410B of the second counter 510 to the preselected threshold value 202.

In one implementation, the timing monitor 200 includes a logical "or" block 516 arranged to output an alert signal (e.g., an error bit) 412 if either the first quantity 410A or the second quantity 410B is greater than the preselected threshold value 202.

In various implementations, additional or alternative components may be used to accomplish the disclosed techniques and arrangements.

Example Timing Signals

Figure 6:
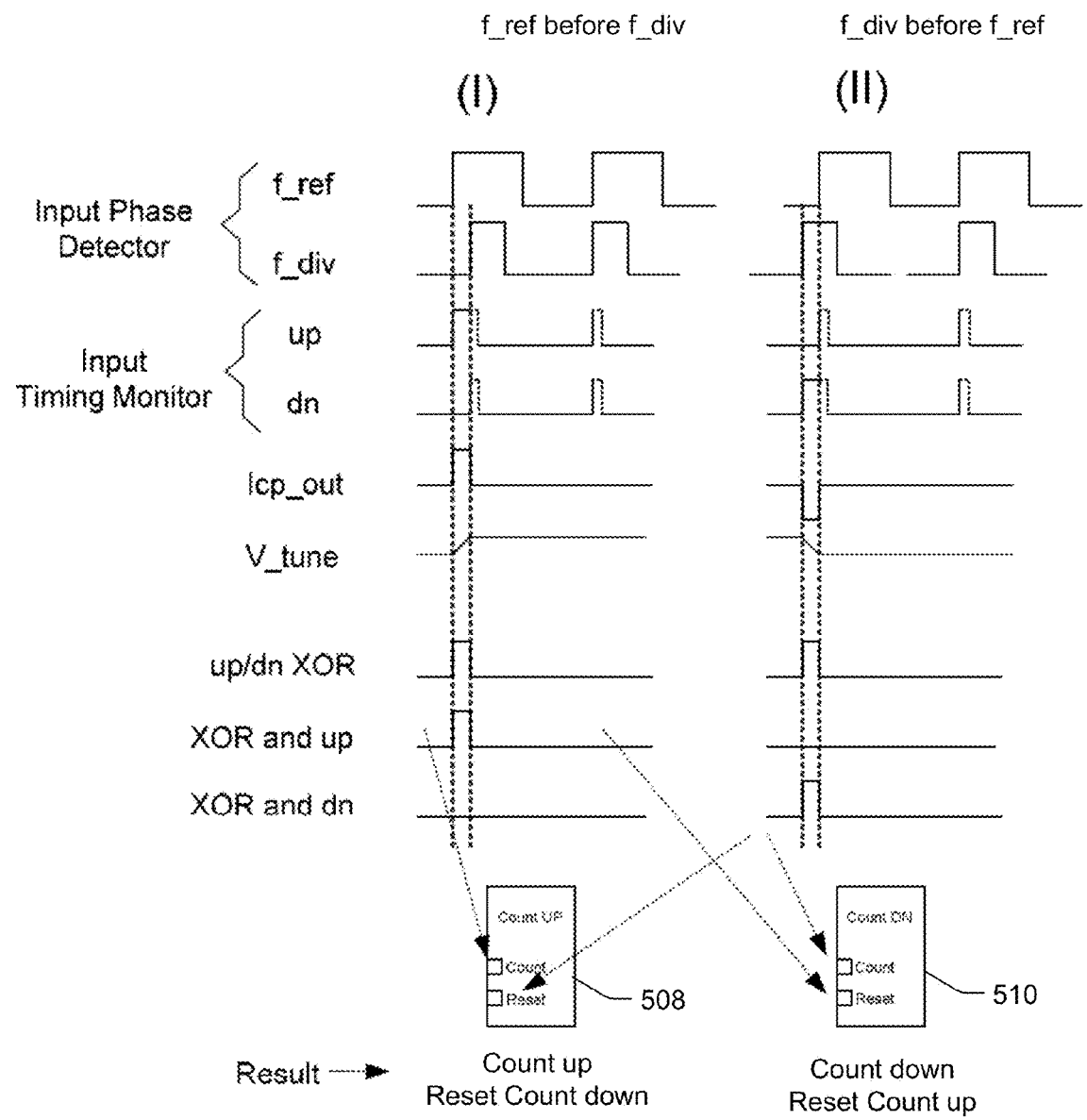
FIG. 6 is a timing diagram of various signals of the example timing monitor of FIG. 5 and the example PLL device of FIG. 2, according to an implementation. The timing diagram shows two example timing scenarios.

FIG. 6 is a timing diagram of various signals discussed above regarding the example timing monitor 200 of FIG. 5 and the example PLL device 100 of FIG. 2, according to an implementation. The timing diagram of FIG. 6 shows two example timing scenarios.

In the first timing scenario (I) illustrated in FIG. 6, the reference frequency f_ref leads the modified frequency f_div. This is shown in the input signals to the phase detector 104 in the first two signal diagrams. The outputs of the phase detector 104 are the inputs to the timing monitor 200, and are shown as "up" and "dn" signals in the illustration. Since the reference frequency f_ref leads the modified frequency f_div, an up control pulse is output from the phase detector 104 to the charge pump 112, with brief duration dn pulses output for stability, as discussed above.

The charge pump 112 outputs a positive pulse Icp_out in response to the up control signal from the phase detector 104. This results in a rise in voltage of the tuning voltage V_tune, which is received by the VCO 102 via the feedback loop 116.

Within the timing monitor 200, the up pulse received from the phase detector 104 is a logical true input signal on the up input. It is "exclusive or'd" (at block 502) with the dn input, which is logically false, resulting in the true pulse shown in FIG. 6 (labeled "up/dn XOR" in FIG. 6). This logical true output "and" the up control signal (at "and" block 504) results in a logical true identity signal 408A pulse (labeled "XOR and up" in FIG. 6). The logical true output "and" the dn control signal (at "and" block 506) results in a logical false identity signal 408B (i.e., no pulse) as shown in FIG. 6 (labeled "XOR and dn").

The logical true identity signal 408A is counted by the counter 508, and resets the counter 510. If the counter 508 reaches a count that is greater than a preselected threshold value 202, as discussed above, the timing monitor 200 will output an alert signal (i.e., timing error bit) 412. Otherwise, a false output (e.g., no signal, logical false, binary 0, etc.) appears at the output of the timing monitor 200.

The second timing scenario (II) illustrated in FIG. 6, is the opposite situation. The reference frequency f_ref lags the modified frequency f_div. This is shown in the input signals to the phase detector 104 in the first two signal diagrams. The outputs of the phase detector 104 are the inputs to the timing monitor 200, and are shown as "up" and "dn" signals in the illustration. Since the reference frequency f_ref lags the modified frequency f_div, the dn control pulse is output from the phase detector 104 to the charge pump 112, with brief duration up pulses output for stability, as discussed above.

The charge pump 112 outputs a negative pulse Icp_out in response to the dn control signal from the phase detector 104. This results in a drop in voltage of the tuning voltage V_tune, which is received by the VCO 102 via the feedback loop 116.

Within the timing monitor 200, the dn pulse received from the phase detector 104 is a logical true input signal on the dn input. It is "exclusive or'd" (at block 502) with the up input, which is logically false, resulting in the true pulse shown in FIG. 6 (labeled "up/dn XOR"). This logical true output "and" the up control signal (at "and" block 504) results in a logical false identity signal 408A (i.e., no pulse) as shown in FIG. 6 (labeled "XOR and up"). However, the logical true output "and" the dn control signal (at "and" block 506) results in a logical true identity signal 408B pulse (labeled "XOR and dn" in FIG. 6).

The logical true identity signal 408B is counted by the counter 510, and resets the counter 508. If the counter 510 reaches a count that is greater than a preselected threshold value 202, as discussed above, the timing monitor 200 will output an alert signal (i.e., timing error bit) 412. Otherwise, a false output (e.g., no signal, logical false, binary 0, etc.) appears at the output of the timing monitor 200.

Example Results

Figure 7:
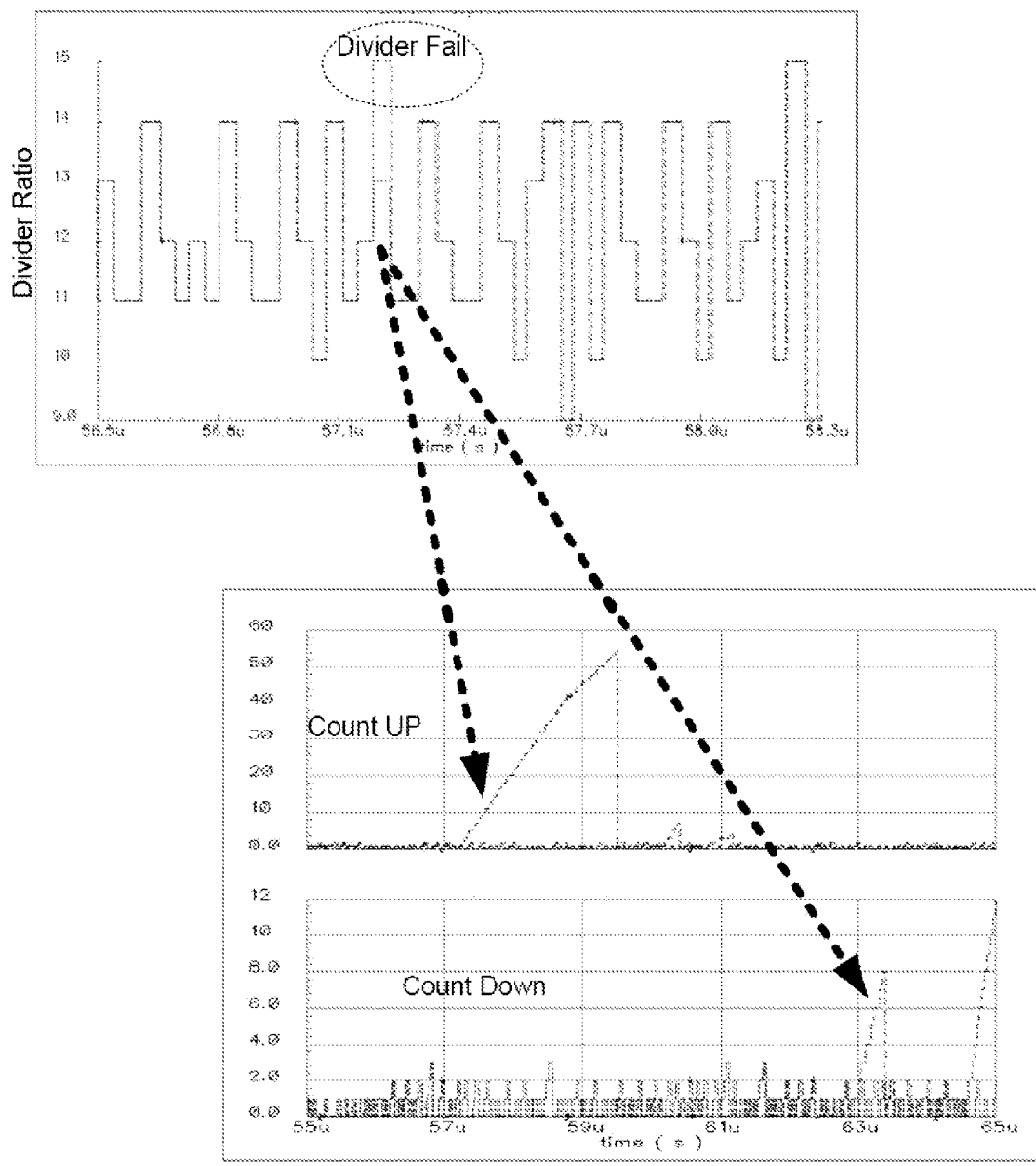
FIG. 7 shows two graphs illustrating an example PLL device error simulation, and example count results, according to an implementation.
Figure 8:
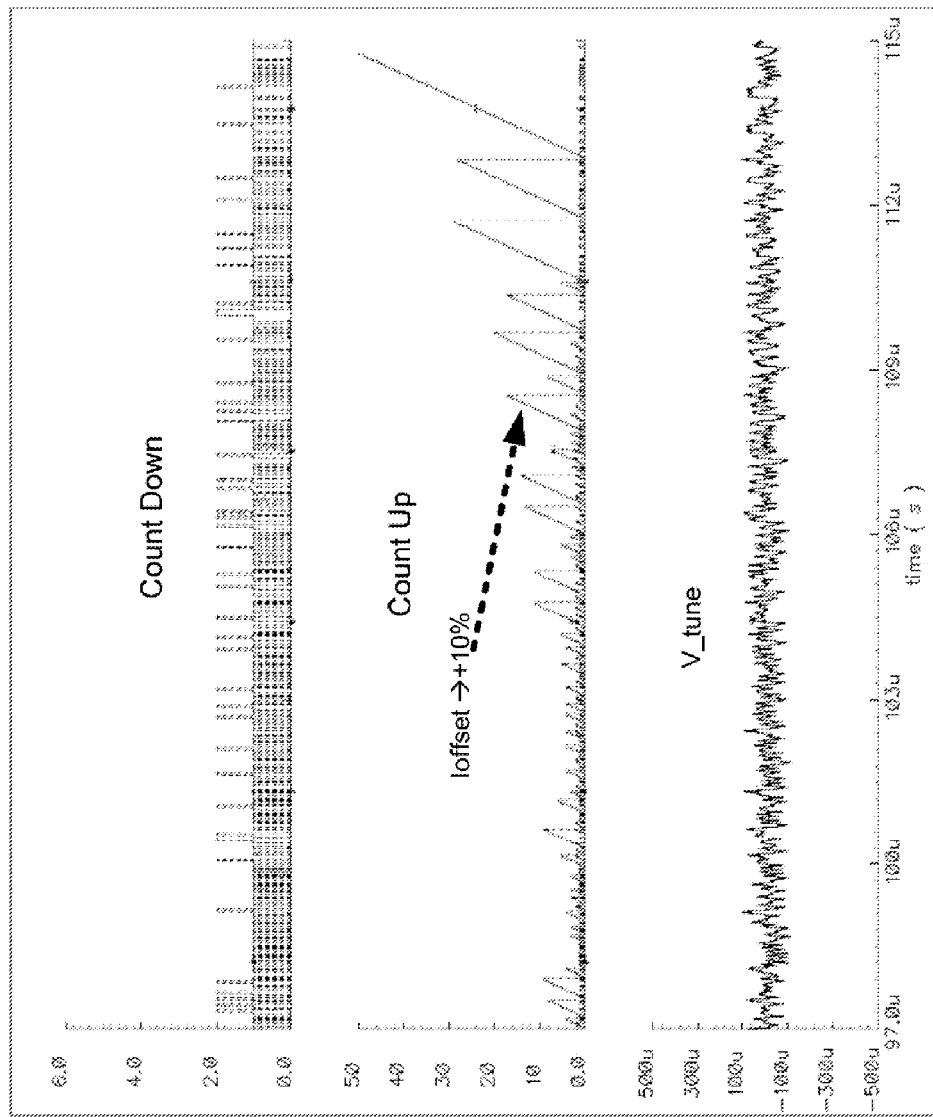
FIG. 8 shows three graphs illustrating another example PLL device error simulation, and example count results and a tuning voltage signal, according to an implementation.

FIGS. 7 and 8 show graphs illustrating example PLL device 100 error simulations, and example results, according to an implementation. As discussed above, an example timing monitor 200 may output the up counts and/or down counts (from the counters 508 and 510, for example). In an implementation, as shown in FIGS. 7 and 8, the up counts and/or down counts may be monitored over time. Anomalies in the count pattern(s) over time may be an indication of a PLL device 100 error. This may be in addition to an alert signal output 412.

In the upper graph of FIG. 7, a simulated divider failure is shown. The divider value should have been 15 for proper operation of the PLL device 100, and instead it is 13 at the one point of failure. The lower graph shows the count up pattern, which is fairly regular around 1 or 2 counts, except for a large anomaly, where the count reaches over 50 at one point. This is the result of the divider error, and is explained by the techniques above. The error is also shown in the count down pattern, where two spikes reach over a count of 8. This is in contrast to counts of 1 to 3 during normal operation of the PLL device 100.

FIG. 8 is a three part graph illustrating another example PLL device 100 error simulation, and example count results and a tuning voltage signal V_tune, according to an implementation. FIG. 8 shows a difference between normal charge pump 112 behavior and behavior with an offset current (here, +10% offset). While the count down pattern shows no unusual anomalies, the count up pattern shows an increasing count with time. The up counts exceed 10 at many points and exceed 40 at one point on the graph. This is an indication of PLL device 100 error.

Additionally, in the lower third of the graph of FIG. 8, the tuning voltage V_tune is shown exhibiting a fairly regular pattern, with no unusual aspects. This is one reason that the tuning voltage is not a reliable indicator of PLL device 100 errors. It is likely from the count up pattern that the phase detector 104 is attempting to significantly increase the output frequency (over-compensate, for example) at the VCO 102, however, this is not reflected in the tuning voltage V_tune.

Representative Process

Figure 9:
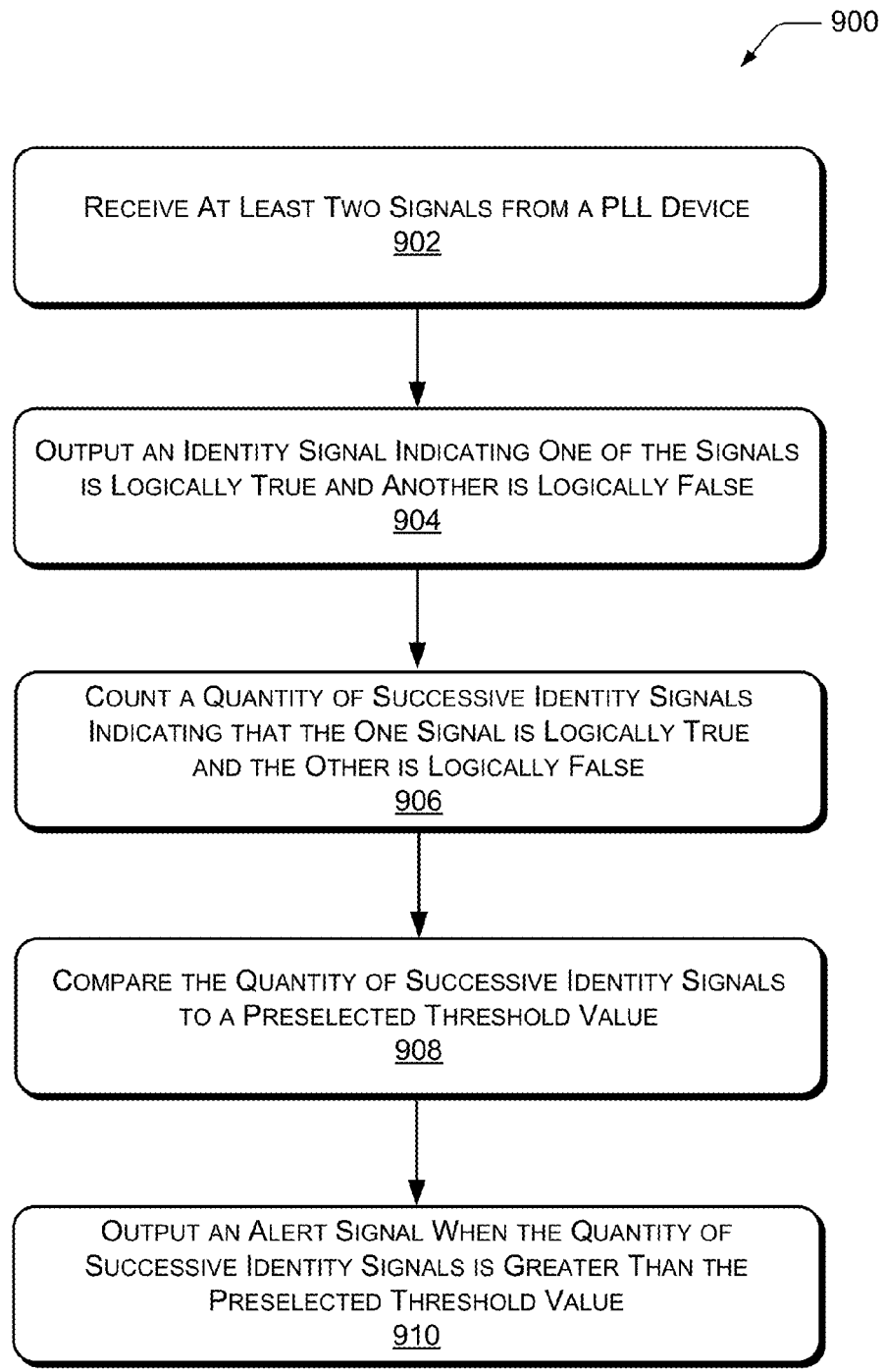
FIG. 9 is a flow diagram illustrating an example process for detecting errors in a PLL device, according to an implementation.

FIG. 9 illustrates a representative process 900 for detecting errors in a PLL device (such as PLL device 100). The process 900 describes counting signal pulses based on phase detector activity within the PLL device. The process 900 is described with reference to FIGS. 1-8.

The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable materials, or combinations thereof, without departing from the scope of the subject matter described herein.

At block 902, the process includes receiving at least two signals from a phase-locked-loop (PLL) device. In an implementation, the at least two signals are received from a phase detector (such as phase detector 104) of the PLL device.

At block 904, the process includes outputting an identity signal (such as identity signal 408) indicating that one of the at least two signals is logically true and another of the at least two signals is logically false. In one example, the process includes outputting the identity signal from an identification block (such as identification block 402). In another implementation, the identification block comprises a logical "exclusive or" block and two logical "and" blocks, or the like.

In one implementation, the process includes outputting the identity signal when the one of the at least two signals temporally leads the other of the at least two signals. In another implementation, the process includes ceasing to output the identity signal when the one of the at least two signals and the other of the at least two signals are logically true or logically false concurrently.

In an implementation, the process includes outputting multiple identity signals. For example, the process may include outputting one identity signal for each input received from the PLL device. In one implementation, each of the multiple identity signals appear on associated individual signal paths and have timing associated with individual input signals received, over time.

At block 906, the process includes counting a quantity of successive identity signals indicating that the one of the at least two signals is logically true and the other of the at least two signals is logically false. In other words, the process includes counting a quantity of consecutive like identity signals. In an implementation, the process includes counting the identity signals at a counter block (such as counter block 404) or one or more counters (such as counters 508 and 510).

In another implementation, the process includes resetting a first count or a first counter when a count is registered at a second counter and resetting a second count or the second counter when a count is registered at the first counter. In one example, the identity signals counted by the counters also reset the opposite counters (first/second) as described above.

At block 908, the process includes comparing the quantity of successive identity signals to a preselected threshold value (such as threshold value 202). In one implementation, the process includes comparing the identity signals to the threshold value at a comparison block (such as comparison block 406) or at a pair of comparators (such as comparators 512 and 514).

At block 910, the process includes outputting an alert signal (such as alert signal 412) when the quantity of successive identity signals is greater than the preselected threshold value. In one implementation, the process includes outputting the alert signal via a logical "or" block (such as "or" block 516).

In one implementation, the alert signal indicates an error of the PLL device. In an example, the alert signal is a timing error bit. For instance, the timing error bit may be read by a diagnostic system, an alarm device, or the like.

In an implementation, the process includes outputting the alert signal when a charge pump of the PLL device performs at least a preselected quantity of successive same polarity operations. For example, if the charge pump performs more than a threshold number of consecutive charge up operations (positive current pulse) or charge down operations (negative current pulse), then an alert signal is output from the timing monitor 200.

In another implementation, the at least two signals received from the PLL device are processed on at least two signal paths. For example, as shown in FIG. 5, each of the at least two signals have an exclusive (e.g., associated) signal path, and each signal path includes an input portion and one or more of an identity portion, a counter portion, and a comparison portion.

In a further implementation, a count of a counter portion at one signal path is reset when a signal at the input portion of the one signal path is logically false and another signal at the input portion of another signal path is concurrently logically true. For example, a counter portion on a first signal path is reset when the first signal path has an input of logic false and a second signal path has an input of logic true. Conversely, a counter portion on a second signal path is reset when the second signal path has an input of logic false and a first signal path has an input of logic true.

In alternate implementations, other techniques may be included in the process 900 in various combinations, and remain within the scope of the disclosure.

Conclusion

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. An apparatus, comprising:
   an identification block arranged to receive at least two signals from a phase detector of a phase-locked loop (PLL) device and to output an identity signal indicating that one of the at least two signals is logically true and another of the at least two signals is logically false, and outputting the identity signal when one of the at least two signals temporally leads the other of the at least two signals;
   a counter block arranged to count a quantity of successive identity signals referencing the one of the at least two signals; and
   a comparison block arranged to output an alert signal based on a comparison of a count of the counter block to a preselected threshold value.

2. The apparatus of claim 1, wherein the counter block is arranged to output an up count or a down count based on a relative temporal position of the at least two signals.

3. The apparatus of claim 2, wherein the counter block is arranged to output an up count when the one of the at least two signals is logically true and the one of the at least two signals temporally leads the other of the at least two signals.

4. The apparatus of claim 2, wherein when the counter block outputs the up count, the counter block resets the down count.

5. The apparatus of claim 1, wherein the at least two signals are binary pulse signals.

6. A system, comprising:
   a phase-locked-loop (PLL) device, including:
   a phase detector arranged to compare a phase of a reference frequency with a phase of a modified frequency and output a control signal on at least one of two outputs based on the comparison, the modified frequency comprising an output frequency of the PLL divided by a divider value; and
   a charge pump arranged to adjust the output frequency of the PLL based on the control signal output at the phase detector; and
   a timing monitor, including:
   an identification block arranged to receive the two outputs of the phase detector and to output a first identity signal when the control signal appears on one of the two outputs prior to the control signal appearing on the other of the two outputs;
   a counter block arranged to count a quantity of successive first identity signals; and
   a comparison block arranged to output an alert signal based on a comparison of a count of the counter block to a preselected threshold value.

7. The system of claim 6, further comprising a divider block arranged to output the divider value, the divider block comprising a sigma-delta modulator.

8. The system of claim 6, wherein the identification block is further arranged to output a second identity signal when the control signal appears on the other of the two outputs and the control signal does not appear on the one of the two outputs.

9. The system of claim 8, further comprising a first counter arranged to count a quantity of successive first identity signals and a second counter arranged to count a quantity of successive second identity signals.

10. The system of claim 9, wherein the first identity signal is arranged to reset the second counter and the second identity signal is arranged to reset the first counter.

11. The system of claim 9, further comprising a first comparator arranged to compare a count of the first counter to the preselected threshold value and a second comparator arranged to compare a count of the second counter to the preselected threshold value.

12. The system of claim 6, wherein the identification block further arranged to cease output of the identity signal when the control signal appears on both of the two outputs concurrently.

13. The system of claim 6, wherein the identification block comprises a logical "exclusive or" block arranged to receive the two outputs of the phase detector and two logical "and" blocks arranged to receive the output of the logical "exclusive or" block, one of the logical "and" blocks also arranged to receive one of the two outputs of the phase detector and the other of the two logical "and" blocks also arranged to receive the other of the two outputs of the phase detector.

14. The system of claim 13, wherein an output of one of the two logical "and" blocks is the first identity signal and an output of the other of the two logical "and" blocks is the second identity signal.

15. The system of claim 6, wherein the control signal is a binary pulse signal.

16. The system of claim 6, wherein the timing monitor is arranged to output the alert signal when the phase of one of the reference frequency or the modified frequency leads the other of the reference frequency or the modified frequency for a quantity of cycles greater than the preselected threshold value.

17. The system of claim 6, wherein the phase detector is arranged to output a control signal on each of the two outputs concurrently when the phase of the reference frequency is substantially equal to the phase of the modified frequency.

18. A method, comprising:
    receiving at least two signals from a phase detector of a phase-locked-loop (PLL) device;
    outputting an identity signal indicating that one of the at least two signals is logically true and another of the at least two signals is logically false, and outputting the identity signal when one of the at least two signals temporally leads the other of the at least two signals;
    counting a quantity of successive identity signals indicating that the one of the at least two signals is logically true and the other of the at least two signals is logically false;
    comparing the quantity of successive identity signals to a preselected threshold value; and
    outputting an alert signal when the quantity of successive identity signals is greater than the preselected threshold value.

19. The method of claim 18, wherein the alert signal indicates an error of the PLL device.

20. The method of claim 18, further comprising ceasing to output the identity signal when the one of the at least two signals and the other of the at least two signals are concurrently logically true or logically false.

21. The method of claim 18, further comprising processing the at least two signals received from the PLL device on at least two signal paths, each of the at least two signals having an associated signal path, each signal path including an input portion and one or more identity portion, a counter portion, and a comparison portion.

22. The method of claim 21, further comprising resetting a count of a counter portion at one signal path when a signal at the input portion of the one signal path is logically false and another signal at the input portion of another signal path is concurrently logically true.

23. The method of claim 18, further comprising outputting the alert signal when a charge pump of the PLL device performs at least a preselected quantity of successive same polarity operations.

* * * * *